(12) United States Patent
Salomoni et al.

(10) Patent No.: US 8,367,456 B2
(45) Date of Patent: Feb. 5, 2013

(54) METHOD FOR PRODUCTION OF CERAMIC TILE WITH PHOTOVOLTAIC CELLS

(75) Inventors: Arturo Salomoni, Bologna (IT); Ivan Stamenkovic, Bologna (IT); Sandra Fazio, Bologna (IT); Barbara Mazzanti, Bologna (IT); Giovanni Ridolfi, Bologna (IT); Emanuele Centurioni, Bologna (IT); Daniele Iencinella, Bologna (IT); Maria Grazia Busana, Fabbrico (IT)

(73) Assignee: Consorzio Universitario per la Gestione del Centro di Ricerca e Sperimentazione per l'Industria Ceramica-Centro Ceramico, Bologna (IT)

( * ) Notice: Subject to any disclaimer, the term of this patent is extended or adjusted under 35 U.S.C. 154(b) by 649 days.

(21) Appl. No.: 12/593,921

(22) PCT Filed: Mar. 30, 2007

(86) PCT No.: PCT/IT2007/000241
§ 371 (c)(1),
(2), (4) Date: Jan. 14, 2010

(87) PCT Pub. No.: WO2008/120251
PCT Pub. Date: Oct. 9, 2008

(65) Prior Publication Data
US 2010/0126564 A1    May 27, 2010

(51) Int. Cl.
*H01L 21/00* (2006.01)

(52) U.S. Cl. .............. 438/96; 438/57; 438/62; 438/66; 438/97; 136/244; 136/252; 136/255; 136/256

(58) Field of Classification Search .............. 438/57–58, 438/62–66, 95–97; 136/251, 255, 244, 256
See application file for complete search history.

(56) References Cited

U.S. PATENT DOCUMENTS

| 5,684,325 A | 11/1997 | Kataoka et al. |
| 2004/0031219 A1 | 2/2004 | Banister |
| 2004/0082097 A1* | 4/2004 | Lohmeyer et al. .............. 438/97 |

FOREIGN PATENT DOCUMENTS

| EP | 1 675 186 | 6/2006 |
| EP | 1 684 362 | 7/2006 |
| ES | 2 153 796 | 3/2001 |
| ES | 2 153 796 A1 | 3/2001 |

(Continued)

OTHER PUBLICATIONS

Patent Abstracts of Japan of JP 2005-159343 dated Jun. 16, 2005.

(Continued)

*Primary Examiner* — Dung A. Le
(74) *Attorney, Agent, or Firm* — Ladas & Parry LLP

(57) ABSTRACT

A method for the production of a tile containing a photovoltaic cell including the steps of:
producing a ceramic base body having one or more through holes and a water absorption equal to or less than 0.5 wt %;
depositing on a surface of that ceramic base body an electro-conductive layer made of Ag or Ag—Al; a plurality of active layers; and a layer of electro-conductive material with grid-like structure, wherein the plurality of active layers includes in succession an n-type layer, a photo-active layer and a p-type layer.

8 Claims, 1 Drawing Sheet

FOREIGN PATENT DOCUMENTS

| | | |
|---|---|---|
| JP | 60-130868 A | 7/1985 |
| JP | 2005-154814 A | 6/2005 |
| JP | 2005-159343 | 6/2005 |
| JP | 2006-204519 A | 8/2006 |
| JP | 2006-294646 A | 10/2006 |
| WO | 2007/022221 A2 | 2/2007 |

OTHER PUBLICATIONS

Iencinella, D., et al. "Solar Cells on Porcelain Stoneware Tiles." *21st European Photovoltaic Solar Energy Conference*, Dresden, Germany (2006) pp. 1697-1699.

English translation of an Action dated May 8, 2012 in respect of counterpart Japanese Application No. 2010-501671.

Espacenet English abstract of JP 60-130868 A.

Espacenet English abstract of JP 2006-294646 A.

Espacenet English abstract of JP 2005-154814 A.

Espacenet English abstract of JP 2006-204519 A.

Office Action in respect of counterpart Mexican Application No. MX/a/2009/010480.

English abstract of ES 2 153 796 A1.

\* cited by examiner

U.S. Patent
Feb. 5, 2013
US 8,367,456 B2
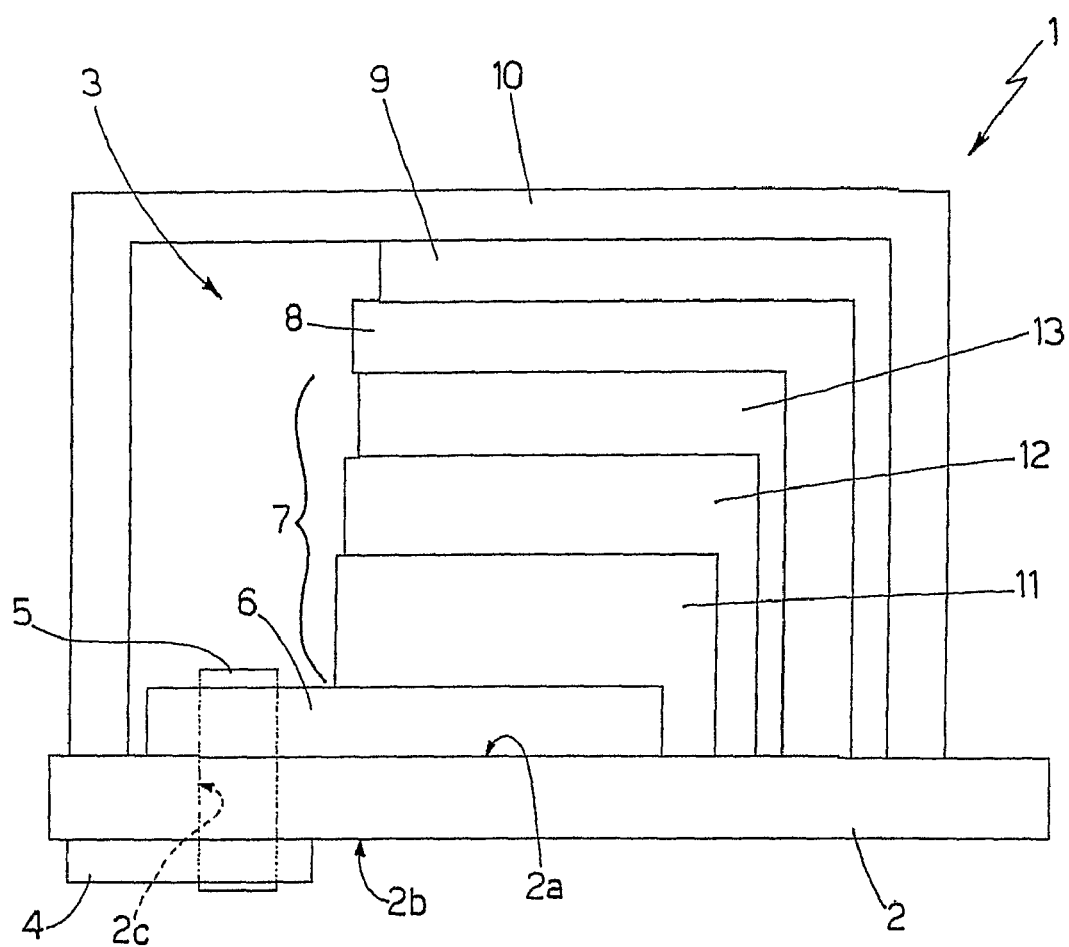

METHOD FOR PRODUCTION OF CERAMIC TILE WITH PHOTOVOLTAIC CELLS

TECHNICAL FIELD

The present invention relates to a ceramic tile with its surface functionalized with photovoltaic cells.

BACKGROUND ART

With the accentuation of the problems linked to finding traditional energy sources, increasing attention is being directed to the study of the exploitation of alternative energy sources, such as for example solar energy. In this regard, for some time now devices have been produced that exploit the photovoltaic effect and thus convert the energy of solar radiation into electrical energy.

Devices of the above type, on account of their technical characteristics, also appear to afford interesting applications in the production of electrical energy in the private and public building sectors.

DISCLOSURE OF INVENTION

The aim of the present invention is to provide ceramic tiles that comprise photovoltaic cells on their exposed surfaces. In this way, it will be possible to use the tiles for coating external surfaces of buildings and at the same time have available devices capable of supplying the buildings themselves with electrical energy deriving from the conversion of solar energy or introducing said energy into the electrical-supply network.

Forming the subject of the present invention is a tile comprising at least one photovoltaic cell, said tile being characterized in that it comprises: a ceramic base body having an absorption of water equal to or less than 0.5 wt %; a photovoltaic cell applied directly to a first surface of said ceramic base body; a device containing the electrical and/or electronic part, applied to a second surface of said ceramic base body; and an electrical connector designed to connect said photovoltaic cell electrically to said device containing the electrical and/or electronic part through said ceramic base body.

According to a preferred embodiment, the photovoltaic cell comprises a layer of electro-conductive material set directly on said first surface of said ceramic base body, a plurality of active layers, and a layer of electro-conductive material with a preferably grid-like structure; said plurality of active layers comprises at least in succession a layer of an n type, a photo-active intermediate layer, and a layer of a p type.

According to a further preferred embodiment, said photovoltaic cell comprises a transparent conductive layer set between said active layers and said layer of electro-conductive material with a preferably grid-like structure.

BRIEF DESCRIPTION OF THE DRAWING

The examples that follow are provided by way of illustrative and non-limiting example to facilitate a better understanding of the invention with the aid of the FIGURE of the annexed drawing, which is a lateral cross-sectional view of a detail of the tile according to the present invention.

BEST MODE FOR CARRYING OUT THE INVENTION

Designated as a whole by 1 in the FIGURE is the tile forming the subject of the present invention.

The tile 1 comprises a ceramic base body 2 having a porosity such as to define an absorption of water lower than or equal to 0.5 wt %, determined according to the ISO 10545-3 standard.

The tile 1 comprises: a photovoltaic cell 3 applied to a first surface 2a of the ceramic base body 2; a device 4 containing the electrical and/or electronic part and applied on a second surface 2b opposite to the surface 2a; and an electrical connector 5, which is housed within a hole 2c made in the ceramic base body 2 and through which it connects the photovoltaic cell 3 electrically to the device 4.

The photovoltaic cell 3 comprises in succession: a layer of conductive material 6, set in direct contact with the surface 2a; a complex of active layers 7; a layer of transparent conductive material 8; a preferably grid-shaped layer of conductive material 9; and a transparent protective layer 10.

In particular, the complex of active layers 7 comprises a layer of an n type 11, an intermediate photo-active layer 12, and a layer of a p type 13.

In what follows, two examples of the process of production of the tile forming the subject of the present invention are provided.

Example 1

The production of the ceramic base body 2 is obtained by means of dry pressing of an atomized ceramic powder typically used for ceramic tiles, the humidity of which must be comprised between 3 and 6 wt %. Pressing is carried out at a pressure of between 35 MPa and 60 MPa. The operation of pressing can use a die that envisages, on the surface 2b, a recess for housing the device 4 that contains the electrical and/or electronic part.

The crude base body obtained by the operation of pressing is dried, and subsequently one or more holes 2c are made, only one of which is indicated in the FIGURE.

The base body thus processed is subjected to a step of baking at a maximum temperature of between 1100° C. and 1250° C. In this way, a ceramic base body 2 is obtained with a porosity equal to or less than 0.5 wt %, determined according to the ISO 10545-3 standard.

Next, applied, for example by means of serigraphic techniques, on the surface 2a of the ceramic base body 2 is an electro-conductive metal layer 6. The electro-conductive layer 6 can consist of a layer of metal, such as for example Ag or an Ag—Al mixture. In order to consolidate said metallic layer and cause it to acquire the necessary properties of electrical conductivity, the semifinished product is subjected to an appropriate thermal treatment that will depend upon the material used. For Ag-based and Ag—Al-based serigraphic pastes, said techniques envisage either a rapid heating/cooling combination undergoing the semifinished product at temperature of 700° C. for 5 minutes, or else a thermal treatment from room temperature to 700° C. at a heating rate of between 5 and 20° C./min. The final thickness of the conductive layer 6 deposited, after baking will range from 5 to 20 μm.

Deposited in succession on the conductive layer 6 by means of a CVD (Chemical Vapour Deposition) technique, preferably a Plasma-Enhanced CVD (PECVD) technique, are: a layer 11 of n-doped amorphous silicon of a thickness of approximately 30 nm, deposited at a maximum temperature of the substrate of approximately 210° C.; a photo-active layer 12 of intrinsic amorphous silicon having a thickness of approximately 580 nm, deposited at a maximum temperature of the substrate of approximately 250° C.; and a layer 13 of p-doped amorphous silicon having a thickness of approximately 15 nm, deposited at a maximum temperature of the substrate of approximately 250° C.

Deposited on top of the second layer 13 of amorphous silicon is a transparent electro-conductive layer 8 of indium-tin oxide (ITO) or fluorine-doped tin oxide (FTO), or other transparent metal oxide. Said deposition can be obtained by means of the technique of sputtering at a temperature of the substrate of approximately 250° C. to obtain a layer 8 with a maximum thickness of approximately 75 nm.

Deposited on top of the transparent electro-conductive layer 8 is a layer of electro-conductive material 9, such as, for example, silver, preferably grid-shaped. The layer 9 can be deposited by means of the serigraphic technique, the doctor-blade technique, by ink-jet printing, sputtering, or by thermal evaporation. Furthermore, the layer 9 can be consolidated by means of an appropriate thermal treatment that will depend upon the material used.

At this point, a conductive connector 5, of a rigid or elastic type, is inserted within the through holes 2c previously made. The conductive connector 5 can be fixed to the ceramic material by means of special materials to ensure firm adhesion.

The connector of a rigid type comprises, at a first end, a head, which rests on the surface 2a, where it is soldered to the layer of conductive material 6, and can comprise, at a second end facing the surface 2b, a pin tin-soldered on the electrical and/or electronic device 4 or, alternatively, a threaded stem designed to be fixed to the electrical and/or electronic device 4 itself with nuts, thus enabling convenient maintenance. The particular conformations of the connector 5 are only described and not illustrated in the FIGURE for reasons of simplicity.

Used as coating of the photovoltaic cell 3 is a protective transparent layer 10, designed to guarantee high transmittance of solar radiation, resistance to humidity and to atmospheric agents, stability to UV rays, and electrical insulation. The protective layer 10 may be constituted by a low-melting vitreous enamel or, alternatively, a polymeric layer of appropriate composition, such as for example polycarbonate or fluorinated polymers (e.g., polychlorotrifluoroethylene (PCTFE), or a combination of polymethyl methacrylate and polyvinyl fluoride).

Finally, on the surface 2b, the device 4 containing the electrical and/or electronic part is fixed to the connector 5 by being placed within the recess made in the ceramic base body 2. The device 4 containing the electrical and/or electronic part is known and not described in detail herein.

The device containing the electrical and/or electronic part 4 can assume the characteristic of electrically passive component, having the purpose of connecting the tiles in series or in parallel with respect to one another in order to raise the voltage and the current available to values that can be adequately handled by static converters of adequate power, which see to introducing the energy produced into the electrical-supply network. Otherwise, the device containing the electrical and/or electronic part 4 can provide, using MOSFET technology, the MPPT (Maximum Power Point Tracking) function, i.e., define the electrical conditions for supplying the maximum power available as a function of the conditions of insolation, and convey them on an intermediate bus with characteristics suitable to its subsequent introduction into the electrical-supply network, and/or direct use and/or use, for storage in batteries.

Example 2

The ceramic tile produced in this second example differs from the tile produced according to Example 1 as regards the composition of the complex of active layers 7 and their production.

Specifically, the base body coming from the step of baking at a maximum temperature of between 1100° C. and 1250° C. and comprising the conductive layer 6 is subsequently heated to a temperature of 450° C. Deposited thereon is a layer 11 of a thickness of between 70 and 150 nm, preferably 100 nm, of compact $TiO_2$ by means of sputtering, with a hydro-alcoholic solution, of a precursor of titanium (for example, a solution of titanium(IV) isopropoxide or titanium(IV) isopropoxyacetylacetonate, as described in Kavan, L., Grätzel, M., "Highly efficient semiconducting $TiO_2$ photoelectrodes prepared by aerosol pyrolysis", Electrochim. Acta, 1995, 40, 5, 643-652). The semifinished product thus obtained is further heated to 500° C. for approximately one hour.

The active layer 12, which consists of a mixture of powders of $TiO_2$ and $CuInS_2$, is deposited on top of the layer 11 of compact $TiO_2$. The active layer 12 can be made up of either a single layer of a mixture of powders (constituted, for example, for 50 wt % by $TiO_2$ powder and 50 wt % by $CuInS_2$ powder), or else be constituted by a number of layers; for example, three layers with weight ratios: 70-30/50-50/30-70 respectively of $TiO_2$ and $CuInS_2$. The active layer is deposited preferably by means of silk-screen printing, but also techniques can be used, such as, for example, the doctor-blade technique, ink-jet printing, printing with silicone rollers, or sputtering. The active layer 12 can be consolidated by means of an appropriate thermal treatment that will depend upon the characteristics of the material used.

The total thickness of the layer (or of the number of layers) is preferably between 1 and 5 μm.

Deposited, with the methods referred to previously, on top of the active layer 12 is a layer of pure $CuInS_2$ 13 with a thickness of between 0.08 and 0.12 μm, preferably 0.1 μm.

At this point, the preparation of the tile proceeds with the deposition of the transparent conductive layer 8, as described in Example 1.

As will emerge obvious to a person skilled in the art, the specific composition of the complex of active layers 7 can differ from the one described above. In particular, the layer of a p type 13 can be made with any compound having the general empirical formula $(IB)(IIIA)(VIA)_2$, where IB designates the elements Cu, Ag, Au; IIIA designates the elements Al, Ga, In, Ti; and VIA designates the elements S, Se, Te.

The present invention makes available a tile with a ceramic base capable of contributing considerably to energy saving, for example insulating a building from the thermal standpoint and simultaneously converting solar energy into electrical energy.

Furthermore, the production steps are conceived in such a way as to enable their integration with the technologies used in the ceramics sector in order to optimize the economics of the process as a whole.

The invention claimed is:

1. A method for the production of a tile comprising a photovoltaic cell, characterized in that it comprises in succession the steps of:
    producing a ceramic base body (2) having one or more through holes (2c) and a water absorption equal to or less than 0.5 wt %, said step comprising:
    an operation of pressing, in which an atomized ceramic powder with a humidity of between 3 wt % and 6 wt % is subjected to an operation of pressing at a pressure of between 35 and 60 MPa,
    an operation of drying, and
    an operation of baking at a maximum temperature of between 1100 and 1250° C.; and
    directly depositing on a surface (2a) of said ceramic base body (2):

an electro-conductive layer (6) made of Ag or Ag—Al;
a plurality of active layers (7); and
a layer of electro-conductive material with grid-like structure (9);
said plurality of active layers (7) comprising in succession an n-type layer (11), a photo-active layer (12) and a p-type layer (13);
 housing in said hole (2c) a conductive connector (5) in such a way that said conductive connector (5) is in electrical contact with said electro-conductive layer (6); and
 applying an electrical and/or electronic device (4) on a surface (2b) of said ceramic base body (2), opposite to said surface (2a); said electrical and/or electronic device (4) being set in electrical contact with said conductive connector (5).

2. The method for the production of a tile comprising a photovoltaic cell according to claim 1, characterized in that said deposition step envisages deposition of a transparent conductive layer (8) set between said active layers (7) and said layer of electro-conductive material (9).

3. The method for the production of a tile comprising a photovoltaic cell according to claim 2, characterized in that said deposition step envisages deposition on said layer of electro-conductive material (9) of a protective layer (10) made of one of the materials comprised in the group constituted by: vitreous enamel, polycarbonate, fluorinated polymers, polychlorotrifluoroethylene (PCTFE), and a combination of polymethyl methacrylate and polyvinyl fluoride.

4. The method for the production of a tile comprising a photovoltaic cell according to claim 3, characterized in that the n-type layer (11) is constituted by n-doped amorphous silicon, the photo-active layer (12) is constituted by intrinsic silicon, the p-type layer (13) is constituted by p-doped amorphous silicon, the transparent conductive layer (8) is constituted by ITO or FTO, and the layer of electro-conductive material (9) is constituted by Ag.

5. The method for the production of a tile comprising a photovoltaic cell according to claim 3, characterized in that the n-type layer (11) is constituted by compact $TiO_2$, the photo-active layer (12) is constituted by a mixture of $TiO_2$ with a compound of general empirical formula $(IB)(IIIA)(VIA)_2$, the p-type layer (13) is constituted by a compound of general empirical formula $(IB)(IIIA)(VIA)_2$, the transparent conductive layer (8) is constituted by ITO, and the layer of electro-conductive material (9) is constituted by Ag;
 IB being one of the elements comprised in the group constituted by Cu, Ag, Au;
 IIIA being one of the elements comprised in the group constituted by Al, Ga, In, Tl; and
 VIA being one of the elements comprised in the group constituted by S, Se, Te.

6. The method for the production of a tile comprising a photovoltaic cell according to claim 5, characterized in that the compound of general empirical formula $(IB)(IIIA)(VIA)_2$ is $CuInS_2$.

7. The method for the production of a tile comprising a photovoltaic cell according to claim 4, characterized in that said depositions of the active layers (11, 12, 13) of amorphous silicon are obtained using the CVD (Chemical Vapour Deposition) technique.

8. The method according to claim 7, characterized in that said depositions of the active layers (11, 12, 13) of amorphous silicon are obtained using the Plasma-Enhanced CVD or Radio-Frequency CVD technique.

* * * * *